United States Patent
Wang et al.

(10) Patent No.: US 7,586,382 B2
(45) Date of Patent: Sep. 8, 2009

(54) METHODS AND SYSTEMS FOR TEMPERATURE RELATED FREQUENCY DRIFT COMPENSATION

(75) Inventors: Chi-Shin Wang, Half Moon Bay, CA (US); Zhike Jia, San Jose, CA (US); Lianxue Xiong, Shanghai (CN); Yinghao Tu, Shanghai (CN)

(73) Assignee: SiRF Technology, Inc., Santa Clara, CA (US)

( * ) Notice: Subject to any disclaimer, the term of this patent is extended or adjusted under 35 U.S.C. 154(b) by 249 days.

(21) Appl. No.: 11/681,568

(22) Filed: Mar. 2, 2007

(65) Prior Publication Data

US 2008/0198070 A1    Aug. 21, 2008

Related U.S. Application Data

(60) Provisional application No. 60/887,328, filed on Jan. 30, 2007.

(51) Int. Cl.
  *G01C 21/00*  (2006.01)
  *H03L 1/00*  (2006.01)

(52) U.S. Cl. ............... 331/176; 331/2; 331/46; 701/214; 342/357.12; 455/255; 455/259; 455/12.1

(58) Field of Classification Search ............ 331/2, 331/46, 176; 701/214; 342/357.12; 455/255, 455/259, 12.1
See application file for complete search history.

(56) References Cited

U.S. PATENT DOCUMENTS

| | | | |
|---|---|---|---|
| 5,229,700 A | 7/1993 | Stitt et al. | |
| 5,841,396 A | 11/1998 | Krasner | |
| 5,893,044 A * | 4/1999 | King et al. | 701/214 |
| 5,945,944 A | 8/1999 | Krasner | |
| 6,041,222 A | 3/2000 | Horton | |
| 6,122,506 A | 9/2000 | Lau | |
| 6,236,623 B1 | 5/2001 | Read | |
| 6,650,879 B1 | 11/2003 | Underbrink | |
| 6,724,342 B2 | 4/2004 | Bloebaum | |
| 6,839,547 B2 | 1/2005 | Nir | |
| 6,867,734 B2 | 3/2005 | Voor | |
| 6,901,265 B2 | 5/2005 | Pratt | |
| 6,965,754 B2 | 11/2005 | King | |

(Continued)

FOREIGN PATENT DOCUMENTS

EP    1605582 A1    12/2005

*Primary Examiner*—Arnold Kinkead
(74) *Attorney, Agent, or Firm*—Pillsbury Winthrop Shaw Pittman LLP (57) ABSTRACT

Systems and methods are provided that compensate for frequency drift due to temperature variation without the need for a temperature sensor. In one embodiment, a navigation receiver with an integrated communication device receives a base station reference signal, which is used to periodically calibrate a local oscillator frequency. In another embodiment, the calibrated local oscillator frequency drives a counter that is used to provide code phase estimation at the start of satellite signal acquisition. To provide temperature compensation in one embodiment, the calibrated local frequency is used to drive one or more counters at different calibration rates (i.e., different time intervals between calibrations). Count values from these counters are used to determine compensation for frequency drift due to temperature variation based on predicted frequency drift variation patterns between calibrations. This temperature compensation does not require a temperature sensor and further improves the accuracy of the code phase estimation.

24 Claims, 7 Drawing Sheets

U.S. PATENT DOCUMENTS

| | | |
|---|---|---|
| 7,053,824 B2 | 5/2006 | Abraham |
| 7,082,292 B2 | 7/2006 | Underbrink |
| 2003/0219082 A1 | 11/2003 | Tanaka |
| 2004/0102165 A1 | 5/2004 | Bloebaum |
| 2004/0130484 A1 | 7/2004 | Krasner |
| 2006/0052131 A1 | 3/2006 | Ichihara |
| 2006/0267703 A1 | 11/2006 | Wang et al. |

* cited by examiner

FIG. 3 TEMPERATURE RAMP COMPENSATION

METHODS AND SYSTEMS FOR TEMPERATURE RELATED FREQUENCY DRIFT COMPENSATION

RELATED APPLICATION

This application claims the benefit of U.S. Provisional Application Ser. No. 60/887,328, titled "Methods And Systems For Acquisition of Very Weak Navigation Signals," filed on Jan. 30, 2007.

FIELD OF THE INVENTION

The present invention relates to satellite based navigational receivers with integrated communications receivers, and more particularly to temperature related frequency drift compensation in these types of receivers.

BACKGROUND OF THE INVENTION

The global positioning system (GPS) is a satellite based radio-navigation system built and operated by the United States Department of Defense. The Russian government operated 'GLONASS' and European Union proposed 'Galileo' are two other important satellite based navigational systems.

GPS permits a user of the system to determine his or her position on the surface of the earth. The system consists of twenty-four satellites circling the earth at an altitude of about 11,000 miles with a period of about 12 hours. It is possible to have more than twenty-four satellites due to the presence of some spare satellites in the GPS constellation. These satellites are placed in six different orbits such that at any time a minimum of six and a maximum of more than eleven satellites are visible to any user on the surface of the earth except in the polar region. Each satellite transmits an accurate time and position signal referenced to an atomic clock. A typical GPS receiver locks onto this signal and extracts the data contained in it and with signals from a sufficient number of satellites, a GPS receiver can calculate its position, velocity, altitude, and time.

We consider the case of Global Positioning System (GPS) as an example. Each of the satellites of the GPS system continuously transmits what is known as Navigation data at a rate of 50 bits/second. The Navigation data contains the clock corrections coefficients, ephemeris, almanacs and some other parameters such as the subframe ID and UTC and some correction terms to correct for the propagation delay due to ionosphere, etc. A subframe consists of 10 words with each word having a length of 30 bits. In this 30 bits, the last 6 bits are parity check bits. A frame on the other hand consists of 5 subframes with the first subframe containing the clock corrections, and the $2^{nd}$ and $3^{rd}$ subframes containing the ephemeris of the satellite from which it is transmitted. This ephemeris gives the accurate position of the satellite and is valid for 4 to 6 hours. The $4^{th}$ and $5^{th}$ subframes contains the almanacs of all the satellites. These almanacs give a less accurate position of the satellites and are valid for up to 6 days. The $4^{th}$ and $5^{th}$ subframes also contain some other navigation parameters. The 25 sequentially received frames form a super frame. These 25 frames contain the almanacs of all of the satellites.

The above data are BPSK modulated with a carrier at 1575.42 MHZ and are additionally spread by separate Pseudo Random Number (PRN) sequences of length 1023 chips. These sequences repeat every one millisecond. There are separate PRN or Gold sequences for each satellite. These sequences have good correlation properties which makes them easily extractable from very noisy weak signals. The high unique autocorrelation under zero shift condition is useful in accurate navigation.

Even though the transmitted frequency of the carrier signal is constant at 1575.42 MHz, the received frequency at the receiver is different because of the Doppler frequency due to the ever changing distance between the receiver and the satellite. This change occurs because of the earth and satellite motion relative to each other. The velocity of the receiver on earth if any also contributes to this Doppler frequency. Further, the drift in the receiver oscillator frequency introduces additional instability in the local frequency. All of these factors widen the range of the frequency search of the received signal.

The position, velocity and time estimation at the receiver requires the receiver to lock onto a sufficient number of satellite signals and to determine the pseudo range and extract the navigation data. This involves a two dimensional search for the frequency and PRN code phase of each of the satellite signals. Thus it is a two dimensional search in frequency and code phase. The PRN code has 1023 chips and the search has to be done at at least half chip intervals. Thus the minimum total code phase to search is 2046 phases. The frequency search involves a search of a number of frequency bins. The number of the bins depends on the bin size and the estimated carrier frequency variation. Further, the bin size depends on the coherent integration length. A correlation over one sequence is usually carried out first with a bin size of 500 Hz. However, for further integrations over several milliseconds the bin size must to be reduced. Thus for a coherent integration over two milliseconds the bin size is 250 Hz. Thus if there are N search bins present, then the acquisition involves the computation of 2046N correlation values. Since the GPS signals are normally weak (low power), this requires several identical confirmation stages before conclusively proving that the signal has been acquired.

A long coherent or non-coherent integration extending over several milliseconds is necessary when the signals are weak. This integration may extend over several hundred milliseconds. A non-coherent integration involves squaring loss and is therefore not efficient. Therefore a coherent integration is usually employed. A long coherent integration of the input signal requires a large number of frequency bins or low residual carrier frequency. If the coherent integration time is $T_c$ seconds, then the carrier frequency or bin size should be less than $$\frac{1}{2T_c} \text{Hz.}$$

In addition to this low frequency requirement, it is necessary to remove the navigation data bits in the signal when the integration time is more than 20 milliseconds. If these data bits are not removed, inversion of the samples may occur and integration result is not useful as cancellations in the summation occur. Therefore, it is necessary to remove the embedded data bits. However as explained earlier, most of these data bits are not known a priori except the preamble at the start of each sub-frame. Further, the navigation data bit edges are synchronized with the one millisecond samples, i.e. a data bit edge will be present within a 20 millisecond interval at one of the samples. Of course, this assumes there is a data bit polarity change within this interval because it may be possible to have consecutive data bits of the same polarity in which case the navigation data bit edge cannot be detected. Thus, the preamble start is aligned with each of the successive one millisecond samples as the starting point and the required coherent integration is carried out. The coherent integration results in a large peak when the data in the received signal matches with this local preamble at one of the one millisecond samples. A threshold value can be determined by a number of prior trials. Thus whenever the coherent integration exceeds this threshold the alignment of the local replica with the received signal may be assumed. As the week number is usually known, it is also possible to use 10 bits of the week number in place of preamble or use both of them. It is also possible to use the HOW word when the time information is available. A separate threshold can be determined when the week number or HOW are used. Thus, the known preamble or HOW word or week number of navigation data is assumed in coherent integration over a duration extending over several NAV data bits. As the threshold value can be determined by prior trial or experimentation, the preamble or the HOW word or week number is identified when the computed integration value is higher than a predetermined threshold value. In this scenario, because of interference or noise, it is possible to obtain more than one code phase position having an integration value greater than the threshold. The actual position may be confirmed by coherent integration after 6 seconds when the preamble or HOW repeats. But the value of HOW will increase by 1 after 6 seconds. For example, the actual position may be confirmed when an integration and an integrations 6 seconds later both exceed the threshold. On the other hand when week number is used, the coherent integration should be repeated after 30 seconds, 30 seconds being the repetition time of week number. The integration may have to be repeated several times in order to confirm a single position. Thus, the preamble or HOW word or week number synchronization is confirmed by integrating several times at regular predetermined time intervals, the predetermined time interval being the repeat time of the patterns.

Thus the above signal acquisition by long integration requires a long time to first fix (TTFF) and the computational load is also large with a large memory requirement. Thus there is a need in the art to improve the TTFF under very weak signal conditions such as in an indoor environment.

Sometimes GPS receivers are required to operate under very weak signal conditions as in the case of foliage or indoors. In the present day practice, the receiver may get "assistance" in the form of additional acquisition aiding messages from a server or base station, which may be wireless or Internet based. However, providing this type of assistance requires additional infrastructure and may not be available in all places. Also, the receiver requires additional hardware to receive the aiding messages. Therefore there is a need to develop GPS receivers that operate in "standalone" mode under weak or indoor signal conditions. In other cases of normal signal power a fast start with lower TTFF may be required as in the case of E911 (Enhanced 911). In addition to the above, methods to reduce power consumption in the receiver is also an important requirement in many applications.

Since obtaining the "assistance" requires the change in the infrastructure and protocol, an alternative method of using the frequency accuracy of communication systems like cellular communications, TV signals, DVB-H/T, DAB, etc. are being explored. A Master-Slave method is used in a high precision time synchronization in U.S. Pat. No. 6,236,623. U.S. Pat. No. 6,041,222 discloses a shared reference oscillator controlled by the base station reference signal. U.S. Pat. No. 5,841,396 uses the cellular base station signal to improve the accuracy of the common base oscillator. The other set of patents which include U.S. Pat. Nos. 7,082,292, 6,650,879 and the US patent application 2004/0132421 also use a common clock source calibrated by the base station signal with no calibration from the GPS receiver. Further, no correction is applied for Doppler frequency change. The TCXO of the communication receiver provides the uncorrected 13 Mhz clock (GSM) while an AFC circuit from the GSM provides the precision clock to the GPS baseband. U.S. Pat. No. 6,724,342 and US patent application 2004/0102165 disclose methods of compensating the common clock drift such as in the case of moving from one cell to another, commonly known as handover. A correction method using a base station signal is disclosed in U.S. Pat. No. 6,965,754 and US patent application 2003/0214436, which also discloses calibration from GPS. Further a temperature correction procedure using a temperature sensor is also included. However, as in the case of the '292, '879, '342 patents and the '421 and '165 patent application, these methods employ AFC correction through a correction module. The '754 patent does not compensate for the Doppler due to the relative motion between the receiver and satellite. US patent application 2003/0219082 uses the common oscillator in demodulation of the GPS signal. U.S. Pat. No. 6,122,506 discloses a GSM/GPS integrated receiver wherein the oscillator frequency is corrected from the frequency correction beacon (FCB) of GSM. U.S. Pat. No. 6,901,265 uses the base station signal but also depends upon a pilot signal.

All of the above noted references only deal with improving the frequency accuracy of the oscillator and do not disclose time accuracy for improved code phase search to decrease the acquisition time especially under very weak signal reception conditions. U.S. Pat. No. 6,839,547 uses two timing references from the base station in a counter. U.S. Pat. No. 5,945,944 uses the timing signal from the base station to determine the time of the day through an internal counter. However, this counter is not used for code phase estimation. The frequency calibration signal is not used for code phase estimation. Finally, U.S. Pat. No. 7,053,824 discloses using a time sync signal for code phase estimation and frequency offset information to reduce the frequency range. This is done without using a counter.

A frequency correction method using a base station signal is disclosed in U.S. Pat. No. 6,965,754 and US patent application 2003/0214436, which also discloses calibration from GPS. Further a temperature ramp correction using a temperature sensor is also disclosed. This '754 patent does not compensate for the Doppler with respect the base station.

When a GPS receiver is used with a communication device and is calibrated by the communication device, the temperature of the device and hence the common oscillator may increase between the calibrations. In an exemplary GSM cellular communication system, the interval between calibrations is 46 ms. As a result, the frequency may increase or decrease during this interval because of the device operation or other reasons. Usually the GPS receiver has to determine the code phase after sleep or power off time and therefore it is necessary to compensate for this frequency drift in order to obtain the accurate code phase and small TTFF.

Systems and methods that compensate for frequency drift due to temperature variation without the need for a temperature sensor are desirable to minimize the cost and power of a receiver.

SUMMARY

Accordingly, exemplary embodiments described herein provide systems and methods that compensate for frequency drift due to temperature variation without the need for a temperature sensor, and are particularly useful to compensate for frequency drift due to temperature variation in navigation receivers with integrated communication devices.

In one embodiment, a navigation receiver with an integrated communication device makes use of a communication base station reference signal to achieve more accurate code phase estimation in addition to the prediction of the Doppler frequency for the acquisition of navigational satellite signals. The base station reference signal is used to periodically calibrate a local oscillator frequency of the receiver. The calibrated local oscillator frequency drives a counter that provides accurate code phase estimation at the start of signal acquisition, thereby reducing the code phase search range. To further improve the accuracy of the code phase estimation and Doppler frequency, exemplary embodiments provide systems and methods for compensating the counter for frequency drift due to temperature variation. In one embodiment, the calibrated local oscillator frequency is used to drive one or more counters at different calibration rates (i.e., different time intervals between frequency calibrations). Count values from these counters are used to determine compensation for frequency drift due to temperature variation based on predicted frequency drift variation patterns between frequency calibrations. This temperature compensation does not require a temperature sensor and further improves the accuracy of the code phase estimation. Embodiments of the present invention are equally applicable over an entire range of temperature variation of the receiver.

The above and other advantages of the exemplary embodiments will be apparent from the following more detailed description when taken in conjunction with the accompanying drawings. It is intended that the above advantages can be achieved separately by different aspects of the invention and that additional advantages of this invention will involve various combinations of the above independent advantages such that synergistic benefits may be obtained from combined techniques.

DETAILED DESCRIPTION

Figure 1:
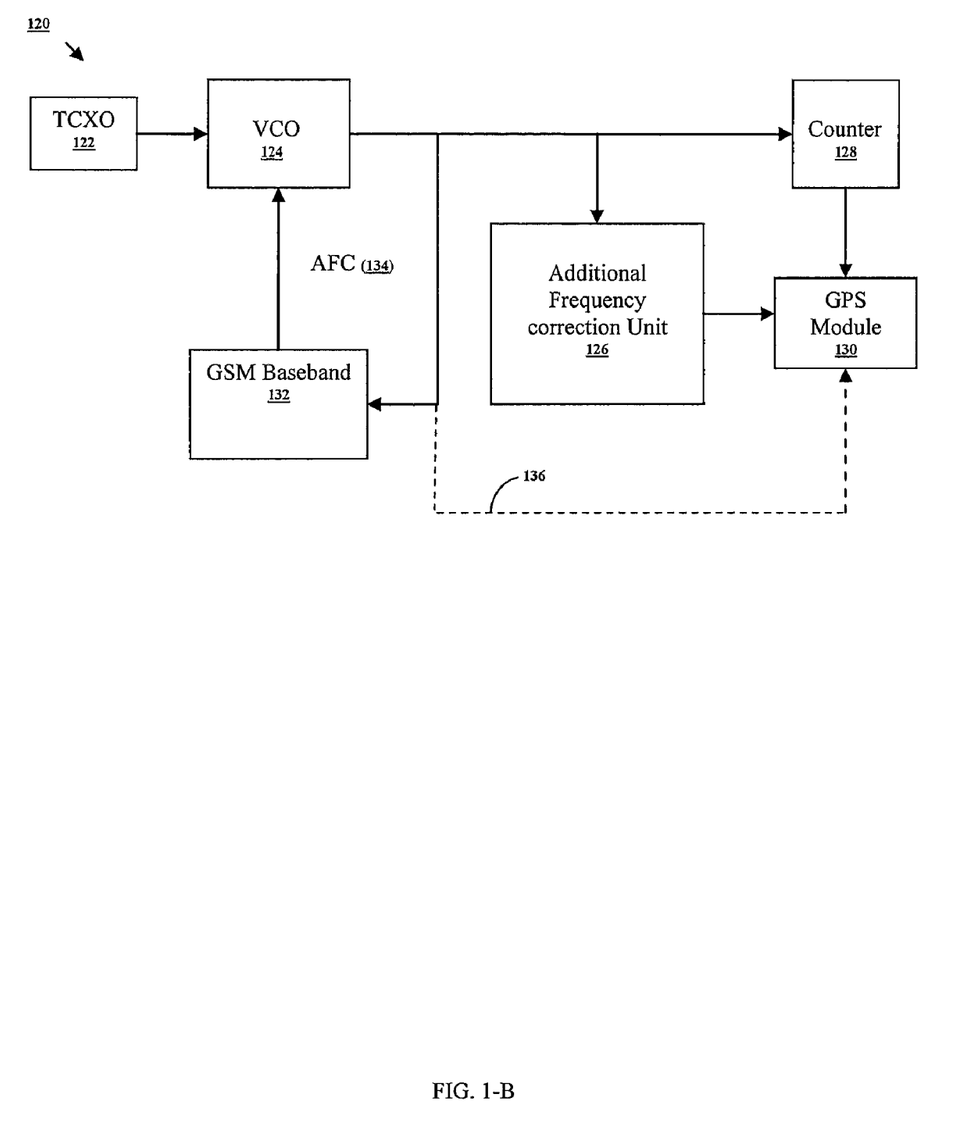
FIG. 1A is a block diagram illustrating a GPS receiver according to an embodiment of the present invention.
FIG. 1B illustrates the use of a base station reference signal to calibrate a local oscillator frequency of a navigation receiver according to an embodiment of the present invention.
Figure 1A:
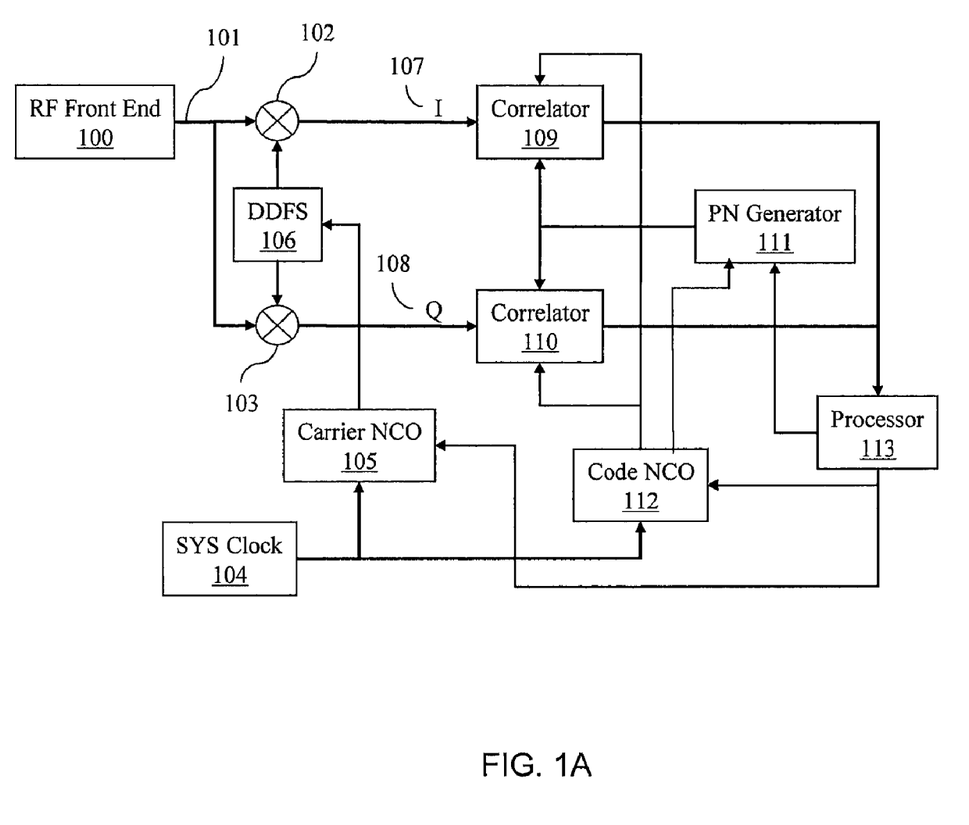

FIG. 1A is a functional block diagram of a GPS receiver according to an embodiment of the present invention. An RF front-end 100 processes the RF signal received at the antenna (not shown). Operations of a conversional RF front-end 100 include amplification, down-conversion, and analog-to digital conversion. The RF front end 100 outputs an intermediate frequency (IF) signal 101 to a baseband section of the receiver from its analog-to-digital converter (ADC) output (not shown). The RF front-end 100 down converts the received RF into the intermediate frequency (IF) for baseband processing. The IF signal 101 is made available to two paths, one in-phase (I) and the other in-quadrature (Q). In the I path, the IF signal 101 is multiplied in IF mixer 102 in-phase with a local frequency signal generated by a direct digital frequency synthesizer (DDFS) 106 to produce the in-phase (I) component 107. In the Q path, the same signal 101 is multiplied by the DDFS frequency in-quadrature (i.e., with a phase shift of 90 degrees) to produce the quadrature (Q) component 108. The DDFS 106 is driven by a carrier numerically controlled oscillator (NCO) 105. In addition, carrier NCO 105 receives phase and frequency corrections from a processor 113. Because of this correction, the DDFS frequency and phase is almost the same as that of IF signal 101 As a result, the I and Q signals produced by the IF mixers 102 and 103 are near zero carrier frequency. In other words, the outputs I 107 and Q 108 of the IF mixers 102 and 103 are stripped or wiped off from the carrier (IF). The I and Q signals may be low-pass filtered to remove the high frequency components which are equal to twice the IF frequency band.

The I and Q components 107 and 108 are correlated in correlators 109 and 110, respectively, with a locally-generated pseudorandom (PN) sequence generated by a PN generator 111. The PN-sequence corresponds to the channel being processed by the baseband section at that time. The PN sequence generator is driven by code NCO 112. The local code generator frequency is made equal to the code rate of the I and Q paths by corrective feedback from the processor 113 to the code NCO 112. In addition, the processor 113 sends a signal to PN code generator 111 to set the starting phase of the locally generated code. The NCO 112 provides the correct clock signals to correlators 109 and 110. For example, NCO 112 provides a clock signal to generate two samples per PN chip in the signal acquisition stage and three samples per chip during the tracking stage. SYS CLK 104 provides to NCO 105 and NCO 112 a common clock synchronization signal. The correlator output values are then sent to processor 113 at every millisecond interval. The processor 113 may be a digital signal processor (DSP) core. Subsequent processing of the signals takes place in the processor 113, as will be described in detail below. Additional details of the receiver baseband section described above can be found in U.S. patent application Ser. No. 11/123,861, titled "Efficient And Flexible GPS baseband Architecture," filed on May 6, 2005, the specification of which is incorporated in its entirety herein by reference.

A navigation or GPS receiver may be embedded with some type of communication device. The communication device may be a cellular device employing any one of the protocols such as CDMA, GSM, PHS or any evolved versions of the same such as WCDMA, UMTS. The communication device may also be another type of communication device such as WIMAX, DVB-H, DVB-T or DAB or any type of device which has a stable clock or pilot signal which can be used to drive a counter in an integrated receiver. In the present disclosure a communication device can refer to a communication device integrated with a navigation receiver or a communication device connected to a navigation receiver, e.g., by a wired or wireless link. These communication devices generates very stable and accurate clock signals transmitted from the base or transmitting station. For example, the GSM base station clock stability is on the order of 0.001 ppm (parts per million) and is considered to be very good for purposes of the present invention. CDMA (IS-95) also has a very good clock stability on the order of 10 micro seconds derived from GPS system. In a communication device with integrated GPS this clock stability can be used to improve the accuracy of the GPS receiver local oscillator, which may be a shared crystal oscillator. Thus, the base station clock stability may be used to improve the performance of the GPS receiver.

FIG. 1B shows an exemplary embodiment of a navigation receiver 120 with an embedded GSM communication device in which the base station clock stability is used to improve the performance of the GPS receiver. The receiver includes a common temperature compensated oscillator (TCXO) 122 providing the needed clock for the GSM and GPS portions of the receiver. In this example, the base station reference frequency is received by the GSM baseband unit 132 which uses the received reference frequency to provide an Automatic Frequency Control (AFC) signal 134 to a Voltage Controlled Oscillator (VCO) 124. The VCO 124 uses the AFC signal 134 to calibrate the TCXO clock signal and output a corrected reference signal to drive a counter 128. The output of the VCO 124 is also fed back to the GSM baseband unit for continuous correction. The counter 128 is used to measure the time interval between the time of last signal tracking and the start of signal acquisition after sleep or power off period. The elapsed time as indicated by the count value of the counter is used to estimate the code phase at the start of signal acquisition. The accuracy of the elapsed time, and hence the estimated code phase, is provided by the corrected reference signal driving the counter and calibrated by the base station signal.

In addition to the calibration by the base station signal, additional compensation schemes may be incorporated to further improve the accuracy of code phase estimation including temperature drift compensation, frequency drift associated with the calibration signal itself, Doppler variation compensation for Doppler with respect to the base station. FIG. 1B shows an example in which additional frequency compensation is computed by a correction unit 126 and used by the GPS module 130 to further compensate the count value from the counter 128 to provide more accurate code phase estimation. Thus it is possible to accurately estimate the code phase at the instance of signal acquisition after sleep or power off period. This estimation reduces the code phase search resulting in fast acquisition of the satellite signal range. The code phase from the last PVT (Position, Velocity and Time) computation during tracking may used to estimate a future new code phase after a time interval as follows:

New Code Phase=Last Code Phase+code phase change over the time interval of {Time elapsed as indicated by the Counter value*(correction factor for temperature)*(correction factor for base station clock bias)+(Difference in GPS signal propagation time between last moment tracking and current GPS acquisition start)} (1)

The last term "Difference in GPS signal propagation time between last moment tracking and current GPS acquisition start" requires determining the satellite position at the time of the last tracking and time of the current acquisition start and may assume that the receiver does not move much (e.g., within a few kilometers) since the last position fix. The satellite position may be computed using satellite orbital modeling with time integration or current ephemeris. This term also includes the displacement of receiver since last position fix. The term "Last Code Phase" is the code phase at the last moment of tracking, at which time the accurate clock counter starts the count.

From the above we can predict the code phase with a much reduced search range. The sequence of search range under this condition is to start from the predicted code phase and proceed in the order +1, −1, +2, −2, +3, −3 samples, . . . etc, where, where 0 represents the predicted central code phase, +n represents the code phase in advance by n half chips while −n represents the code phase delayed by n half chips. The code search is done over a given range based on the magnitude of the error expected in the count. This error depends on the range and rate of temperature change, velocity of the GPS receiver with respect to the base station and satellites and drift range of the reference signal from the communication system. Based on these factors and prior trials the maximum code phase error can be predicted. The search range is selected based on the magnitude of the maximum predicted error. In case this predicted error is too large, e.g., approaching 1023 half chip samples, the full sequence search is done. Thus, the code phase search range is usually determined by prior trials based on the maximum predicted error.

Additional details of the use of a communication base station reference signal to reduce the code phase and Doppler search range is disclosed in U.S. Provisional Application Ser. No. 60/887,328, titled "Methods And Systems For Acquisition of Very Weak Navigation Signals," filed on Jan. 30, 2007, the specification of which is incorporated in its entirety by reference. As described in this Provisional Application, the Doppler frequency can be determined based on the rate of change of the code phase.

Figure 2:
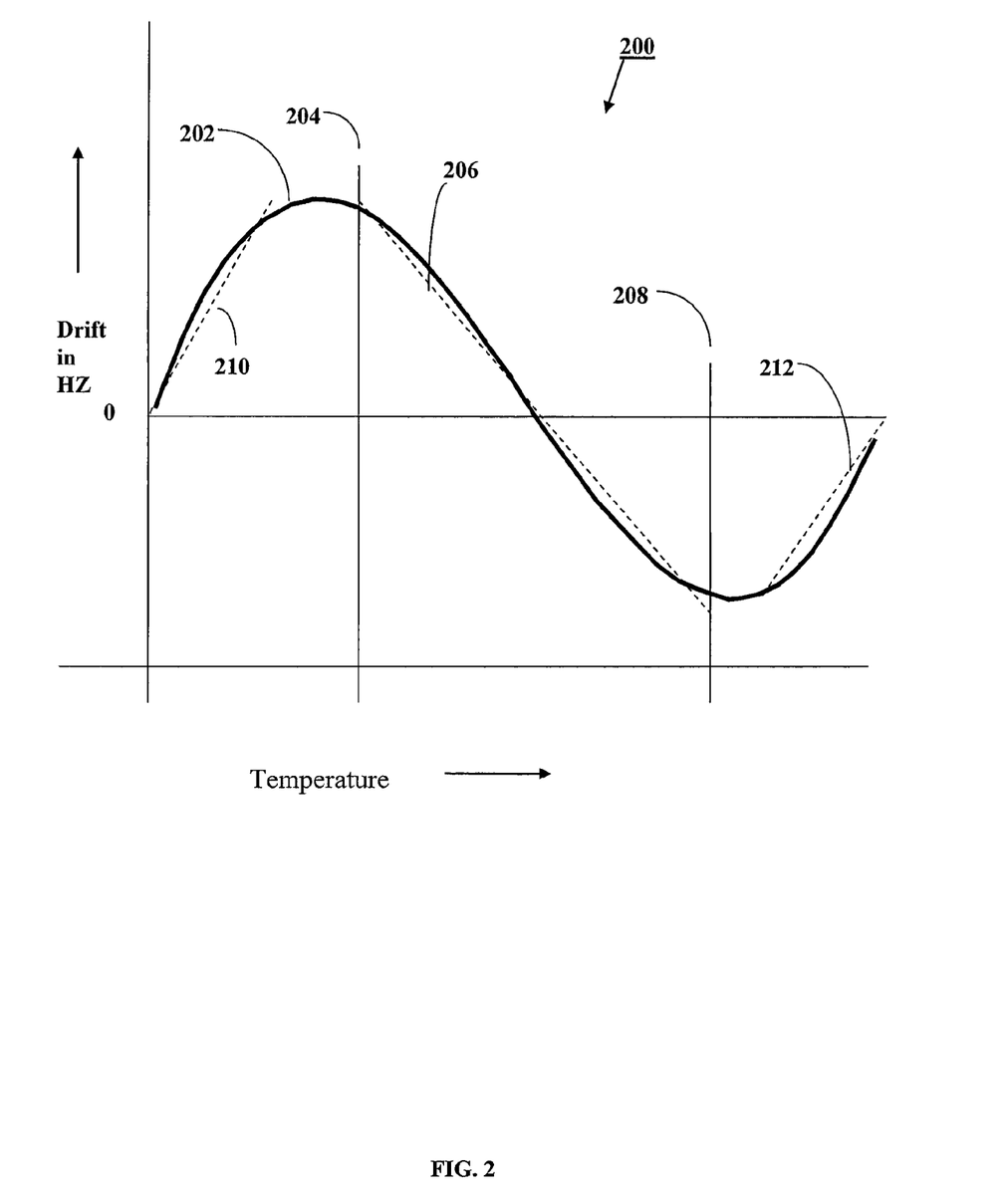
FIG. 2 illustrates a typical frequency drift versus temperature curve for an exemplary crystal oscillator.

As explained above, one of the errors that may be corrected for accurate estimation of the code phase is the correction for the frequency drift due to temperature variation. Embodiments of the invention provide frequency drift compensation for temperature variation without the need for a temperature sensor. A crystal oscillator in a communication or GPS receiver generates the local reference signal. This oscillator may be a plain crystal oscillator (XO) or a temperature compensated crystal oscillator (TCXO). The crystal oscillator frequency, whether from an XO or TCXO, changes with changes in temperature which may be in the range of 8 to 20 ppm or more in the case of XO while it is up to 3 ppm in the case of TCXO. The XO frequency variation with temperature is characterized by an "S" curve 200 shown in FIG. 2. The curve shows the frequency decreasing in the region between temperatures 204 and 208. Temperature 204 may correspond to around −10 C while temperature 208 may be around 50 C. In the region between temperatures 204 to 208, the curve may be approximated by a straight line 206. This region covers most of the normal operating temperature range or the receiver. The other regions below temperature 204 and above temperature 208 can also be approximated by straight lines 210 and 212 with different slopes. These variations and hence the corresponding slopes for lines 210 and 212 which are outside the normal temperature range may be selected manually. Thus the disclosed invention can be used in all of the temperature ranges. In most of the cases, the TCXO curves can be treated similarly.

Figure 3:
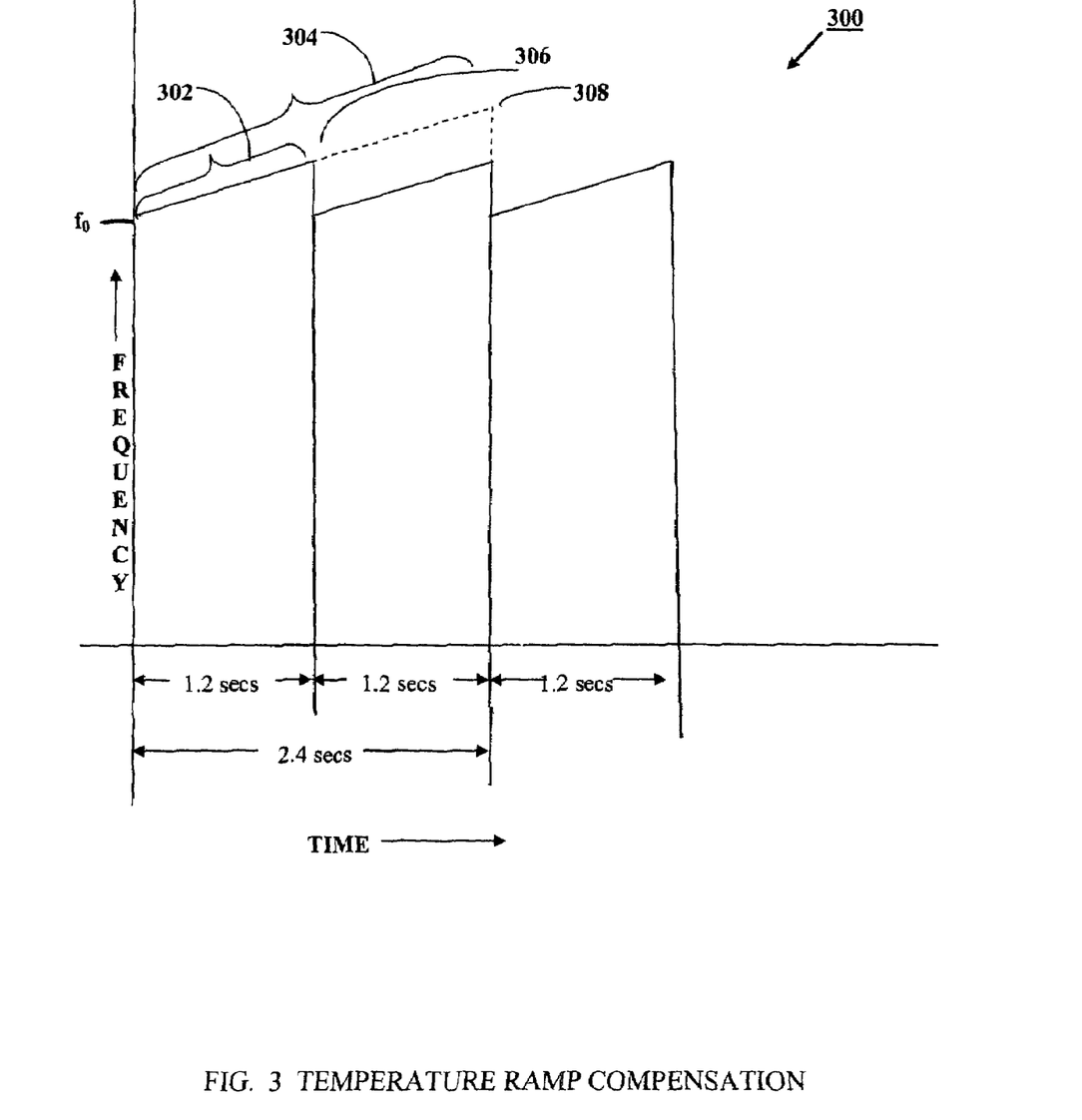
FIG. 3 illustrates frequency ramps due to temperature changes in a receiver.

The linear approximation of the frequency drift change with temperature can be used in compensating the frequency drift between successive time synchronization signal receptions. An example in which a GSM cellular device is integrated with a navigation receiver is considered. In a GSM cellular communication system, a time synchronization signal is transmitted from the base station every T seconds, which can be received by the GSM cellular device and used to calibrate the local frequency every T seconds. Although the calibration can correct for frequency drift at each calibration instance, there is frequency drift between calibration instances that introduces error in the count value of the counter used to estimate the code phase. FIG. 3 shows the frequency of the reference signal versus time. The count value is proportional to the area under the frequency versus time curve, in which changes in the area, and hence the associated count value, caused by frequency drift represents the error due to frequency drift. As shown in FIG. 3, the frequency drift can be assumed to be increasing or decreasing linearly with temperature between calibrations. However, non-linear variation of the frequency drift can also be considered and treated as such. In FIG. 3, temperature ramps introduce frequency ramps indicated by 300. The frequency linearly ramps up from $f_0$ at the time instance zero to a value shown by 306 at which point the frequency is calibrated back to $f_0$ by the AFC after T seconds. The T second ramp is shown by ramp 302. A ramp for a time duration of 2T seconds between calibrations is shown by ramp 304. The 2T second ramp 304 ramps up to a value shown by 308 at which point the frequency is calibrated back to $f_0$. The area under the ramp represents the increase in the count due to temperature change. $N_{f0}$ is the total count for T seconds when no temperature ramp is present as represented by the area under the horizontal line at $f_0$ and $N_{1T}$ is the same area with the T second ramp included. Let $N_{1T}=N_{f0}+\Delta$; where $\Delta$ is the additional count due to a T second ramp. Over a period of 2T seconds $N_1=2N_{f0}+2\Delta$. The total count for a time duration of 2T seconds between calibrations is equal to $2N_{f0}+4\Delta$. Therefore, the correct count over 2T seconds is given by $2N_1-N_2$, where $N_1$ and $N_2$ are taken over the same period, e.g., 2T seconds. Therefore, we can get the temperature correction factor $\beta$ as:

$$\beta = \frac{2N_1 - N_2}{N_1} \quad (2)$$

If the count value from the counter is n, then the corrected compensated count $n\,f_0$ is given by:

$$n_{f0}=n*\beta=n*(2N_1-N_2)/N_1 \quad (3)$$

The count value may be the count from the time of last signal tracking to the start of signal acquisition.

Figure 4:
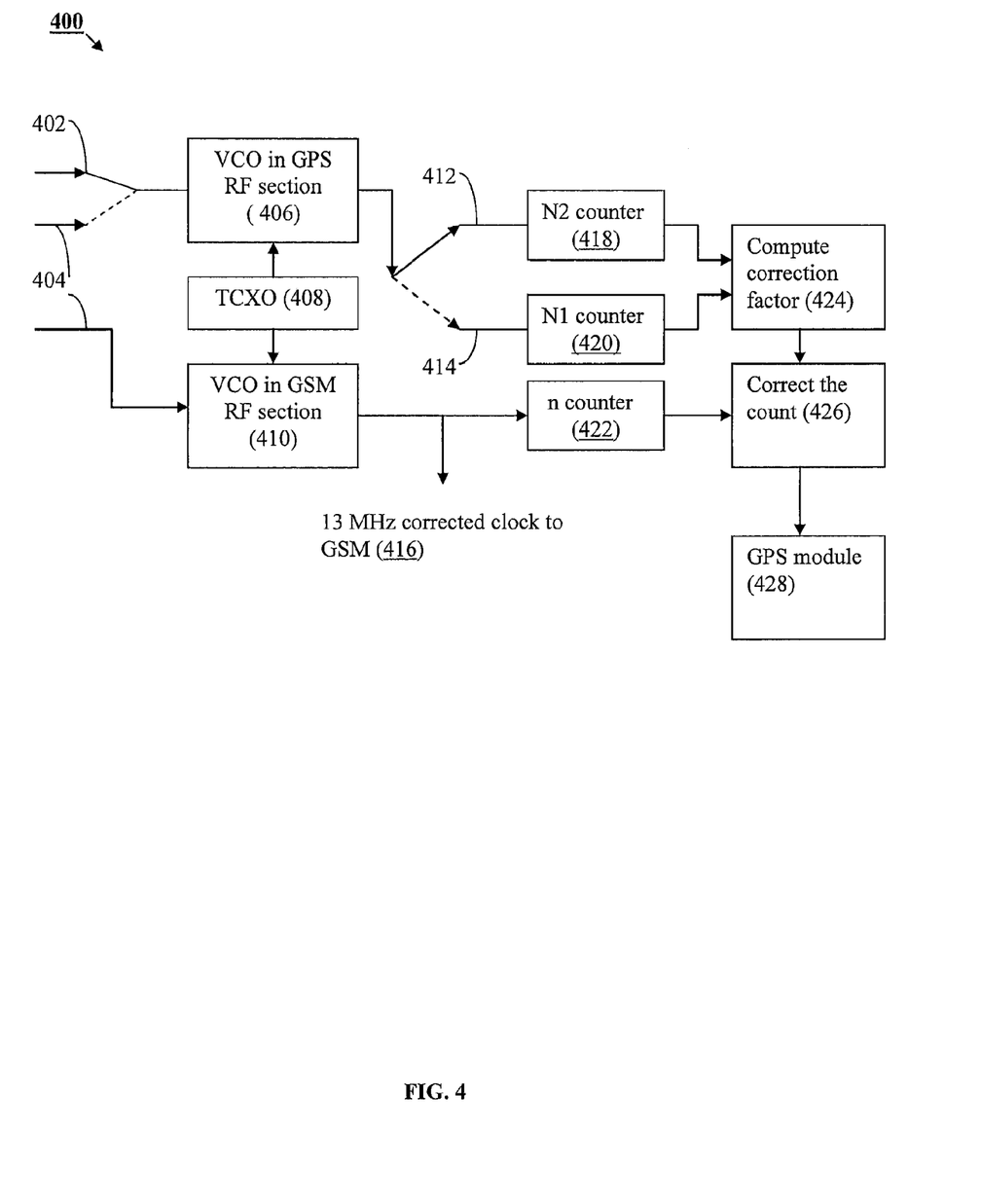
FIG. 4 illustrates an apparatus employing two counters for frequency drift compensation due to temperature variation according to an embodiment of the present invention.

FIG. 4 shows a receiver implementing a temperature correction factor according to an embodiment of the invention. The receiver includes a first Voltage Controlled Oscillator (VCO) 410 and a second VCO 406 with a shared TCXO 408. The output of the first VCO 410 is calibrated by an AFC 404 from the GSM baseband 416 (not shown) which occurs every T seconds. The output of the first VCO 410 drives an n counter 422. The output of the second VCO 406 is calibrated by the T second AFC 404 from the GSM baseband 416 and a 2T second AFC 402 which occurs every 2T seconds. The second VCO 406 alternates between the two AFCs 402 and 404 every 2T seconds with one 2T second AFC 402 followed by two consecutive T second AFCs 404. In the example of GSM, T may be 1.2 seconds and 2T may be 2.4 seconds.

In operation, the $N_1$ counter 420 is connected to VCO 406 through the connector 414 during which time the T second AFC 404 is inputted to the VCO 406. This connection stays for two consecutive time intervals of T seconds. At the end of the two consecutive time intervals of T seconds, the connection is shifted to the $N_2$ counter 418 through the connector 412 for 2T seconds during which time the 2T second AFC 402 is inputted to the VCO 406. The VCO 406 may be switched between the two counter by a Single Pole Double Through (SPDT) switch controlled by AFC timing. On the other hand, the n counter 422 always stays connected to VCO 410 and starts counting when the signal tracking by the GPS receiver stops. The n counter 422 stops counting at the instance when the GPS receiver starts acquiring the satellite signals next time. The correction factor computation module 424 receives the count values from the $N_1$ counter 420 and the $N_2$ counter 418 and computes a temperature correction factor $\beta$ according to equation (2). A count correction module 426 receives the count value from the n counter 422 and applies the temperature correction factor $\beta$ from module 424 to the count value to obtain a corrected or compensated count value. The corrected count is used to determine the actual elapsed time from which the signal code phase may be estimated in the GPS module 428.

The $N_1$ and $N_2$ counts need not be counted during the entire time that the n counter is counting. For example, sets of these counts may be enough to determine the compensation factor when the effects of temperature are assumed constant. This way, power can be conserved during the sleep time and the $N_1$ and $N_2$ counters may be smaller. In other cases, more sets of these counts may be taken when the temperature variation is uneven and cannot be assumed constant. In all of these cases, an average compensation factor may be determined during the sleep time and may be used as the final compensation factor applied to the n count.

The temperature correction factor is not limited to the AFC time intervals of T and 2T seconds, and can be applied to any AFC time intervals. For a first AFC time interval, and a second AFC time interval that is m times longer, where m is greater than one, the correction factor $\beta$ may be given by:

$$\beta=(m*N_1-N_m)/(m-1)*N_1 \quad (4)$$

where $N_1$ is the count for the first AFC time interval and $N_m$ is the count for the second AFC time interval. The two counts $N_1$ and $N_m$ are taken over the same base time.

Figure 5:
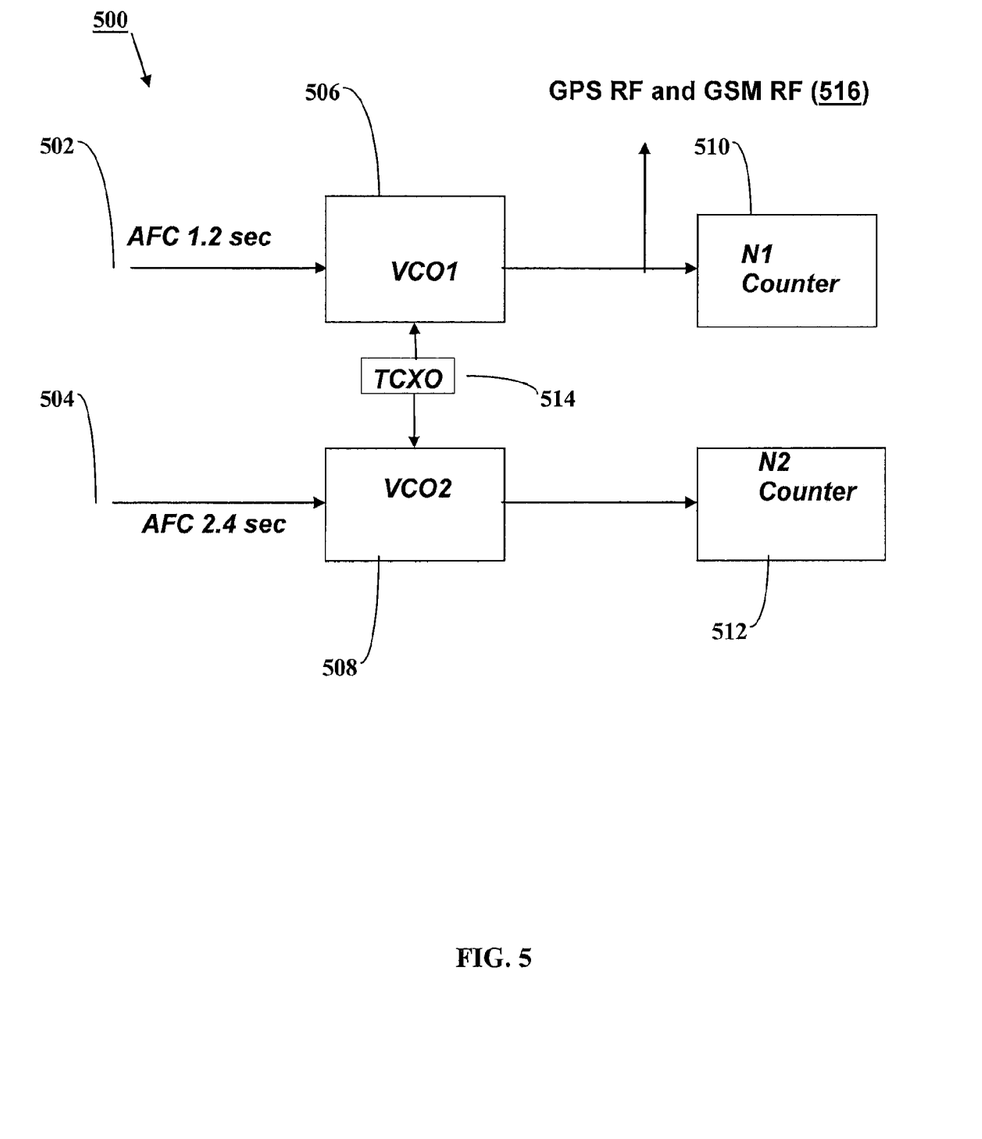
FIG. 5 illustrates an apparatus employing two separate VCOs for frequency drift compensation due to temperature variation according to another embodiment of the present invention.

FIG. 5 shows another embodiment for computing the temperature correction factor. This embodiment includes two separate VCOs driving the $N_1$ counter 510 and the $N_2$ counter 512. VCO1 506 drives the $N_1$ counter 510 while VCO2 508 drives the $N_2$ counter 512. VCO1 506 is calibrated by a T second AFC while VCO2 508 is calibrated by a 2T second AFC. The temperature correction is computed from the count values of the $N_1$ counter 510 and the $N_2$ counter 512 same as before. The embodiment of FIG. 5 may be used when the two VCOs are closely matched, e.g., are fabricated on the same chip.

The correct count may be given by $2N_1-N_2$ if the $N_1$ and $N_2$ counters operate throughout the sleep time and are as accurate as the n counter.

Figure 6:
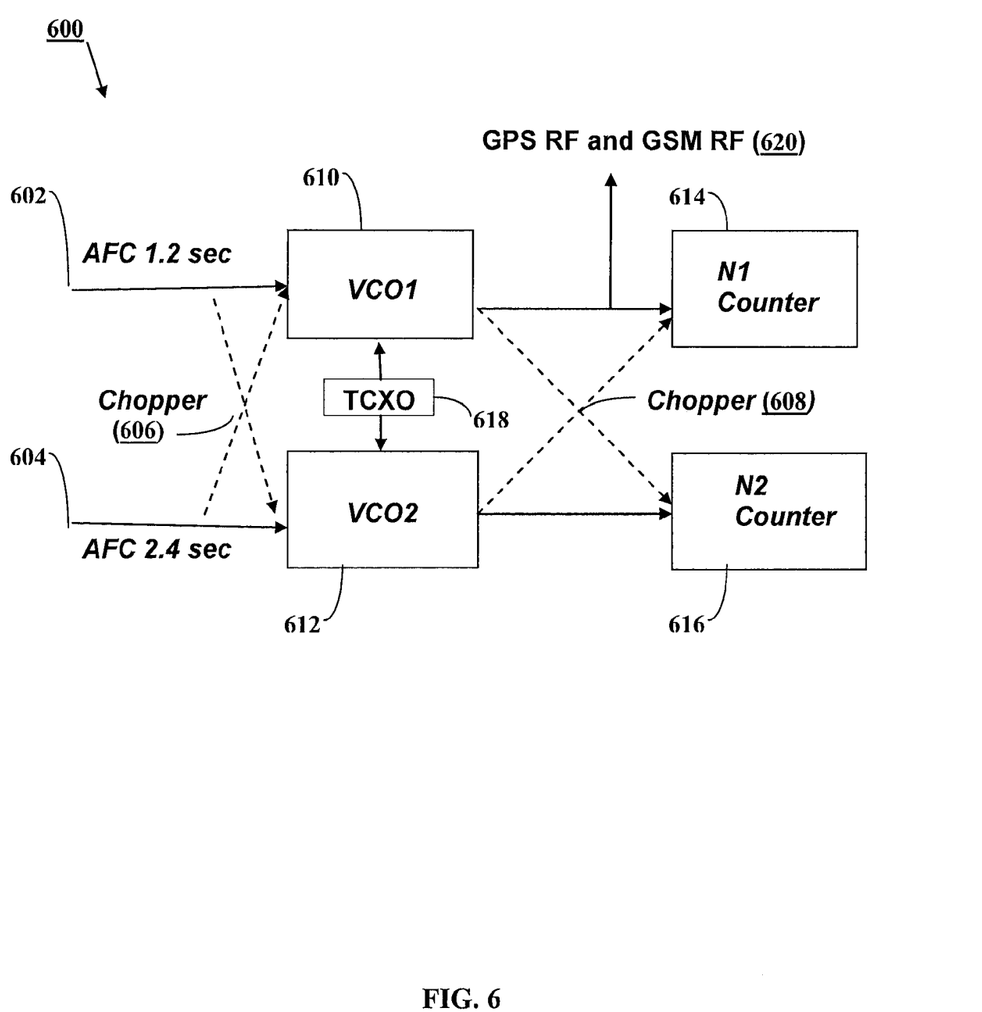
FIG. 6 illustrates an apparatus employing choppers to interchange the two VCOs according to another embodiment of the present invention.

FIG. 6 shows another embodiment that may be used to cancel out mismatches between the VCOs. In this embodiment, a first chopper 606 interchanges the connections between the AFCs 602 and 604 and the VCOs 610 and 612. Similarly, a second chopper 608 interchanges the connections between the VCOs 610 and 612 and the $N_1$ and $N_2$ counters 614 and 616. In one 2T second period, the T second AFC 602 and $N_1$ counter 614 are connected to VCO1 610 by the choppers and the 2T second AFC 604 and $N_2$ counter 616 are connected to VCO2 612 by the choppers. In the next 2T second period, the T second AFC 602 and $N_1$ counter 614 are connected to VCO2 612 by the choppers and the 2T second AFC 604 and $N_2$ counter 616 are connected to VCO1 610 by the choppers. Thus, the VCOs are interchanged every 2T seconds. This interchange of the VCOs advantageously cancels out mismatches between the VCOs.

The choppers may be implemented using two SPDT switches as described above.

Although the present invention has been described in terms of the presently preferred embodiments, it is to be understood that the disclosure is not to be interpreted as limiting. Various alterations and modifications will no doubt become apparent to those skilled in the art after having read this disclosure. For example, although the above embodiments have been described using the GPS system as an example, the techniques and methods may be used for other global satellite navigational systems including GLONASS, Galileo, secondary systems such as WASS, EGNOS, and MSAS, as well as hybrids of the above systems and ground based systems such as pseudolites. Further all types of communication systems where a stable reference frequency or sync signal is available can be considered as reference signal source. Accordingly, it is intended that the appended claims be interpreted as covering all alterations and modifications as fall within the spirit and scope of the invention.

What is claimed is:

1. A method of providing compensation for frequency drift due to temperature variation in a navigation receiver, comprising:
   generating a local frequency using a local oscillator in the receiver;
   periodically calibrating the local frequency using a reference signal;
   driving a plurality of counters with the calibrated local frequency; and
   computing a count correction to compensate for temperature variation using count values from at least two of the counters.

2. The method of claim 1, further comprising receiving the reference signal at the receiver from an external source.

3. The method of claim 1, further comprising calibrating the local frequency using a plurality of Voltage Controlled Oscillators (VCOs).

4. The method of claim 3, further comprising inputting at least one AFC signal to the VCOs to calibrate the local frequency.

5. The method of claim 4, inputting two AFC signals to at least one of the VCOs, wherein the two AFC signals calibrate the local frequency at different calibration rates.

6. The method of claim 5, wherein one of the calibrations rates is m times longer than the other calibration rate, where m is an integer greater than one.

7. The method of claim 3, further comprising periodically interchanging the VCOs to compensate for mismatches of the VCOs.

8. The method of claim 3, wherein the VCOs are used in a Radio Frequency (RF) section of a navigation receiver and an RF section of a communication device.

9. The method of claim 1, wherein the counters count during a time period when the navigation receiver is not tracking satellite signals.

10. The method of claim 3, further comprising:
    inputting a first AFC signal to a first one of the VCOs to calibrate the local frequency at a first calibration rate;
    inputting a second AFC signal to a second one of the VCOs to calibrate the local frequency at a second calibration rate;
    driving a first one of the counters with the calibrated local frequency from the first VCO;
    driving a second one of the counters with the calibrated local frequency from the second VCO; and
    computing the count correction to compensate for temperature variation based on count values from the first and second counters.

11. The method of claim 10, further comprising periodically interchanging the first and second VCOs to compensate for mismatches between the first and second VCOs.

12. The method of claim 1, further comprising:
    using the corrected count value to determine an elapsed time period from a time of last signal tracking to a time of signal acquisition; and
    estimating a code phase for signal acquisition based the elapsed time period.

13. A navigational receiver, comprising:
    a local oscillator for generating a local frequency;
    a calibration module coupled to the local oscillator for periodically calibrating the local frequency using a reference signal;
    a plurality of counters driven with the calibrated local frequency; and
    a correction module coupled to at least two of the counters, wherein the correction module computes a count correction to compensate for temperature variation using count values from the at least two counters.

14. The receiver of claim 13, wherein the reference signal is received at the receiver from an external source.

15. The receiver of claim 13, wherein the calibration module comprises a plurality of Voltage Controlled Oscillators (VCOs).

16. The receiver of claim 15, wherein at least one AFC signal is inputted to the VCOs to calibrate the local frequency.

17. The receiver of claim 16, wherein two AFC signals are inputted to at least one of the VCOs, the two AFC signals having different calibration rates.

18. The receiver of claim 17, wherein one of the calibrations rates is m times longer than the other calibration rate, where m is an integer greater than one.

19. The receiver of claim 15, further comprising:
    a first chopper coupled to inputs of at least two of the VCOs; and
    a second chopper coupled to outputs of the at least two VCOs;
    wherein the first and second choppers periodically interchange the at least two VCOs to compensate for mismatches of the at least two VCOs.

20. The receiver of claim 15, wherein the VCOs are used in a Radio Frequency (RF) section of a navigation receiver and an RF section of a communication device.

21. The receiver of claim 1, wherein the counters count during a time period when the navigation receiver is not tracking satellite signals.

22. The receiver of claim 1, further comprising:
    a first one of the VCOs receiving a first AFC signal to calibrate the local frequency at a first calibration rate;
    a second one of the VCOs receiving a second AFC signal to calibrate the local frequency at a second calibration rate;
    a first one of the counters driven with the calibrated local frequency from the first VCO; and
    a second one of the counters driven with the calibrated local frequency from the second VCO; and
    wherein the correction module computes the count correction to compensate for temperature variation based on count values from the first and second counters.

23. The receiver of claim 22, further comprising:
    a first chopper coupled to inputs of the first and second VCOs; and
    a second chopper coupled to outputs of the first and second VCOs, wherein the first and second choppers periodically interchange the first and second VCOs to compensate for mismatches of the first and second VCOs.

24. The receiver of claim 13, further comprising a navigation computation module, wherein the navigation computation module uses the corrected count value to determine an elapsed time period from a time of last signal tracking to a time of signal acquisition; and estimates a code phase for signal acquisition based the elapsed time period.

* * * * *